United States Patent
Yang et al.

(10) Patent No.: US 10,644,130 B2
(45) Date of Patent: May 5, 2020

(54) METAL-OXIDE-SEMICONDUCTOR FIELD-EFFECT TRANSISTOR WITH SPACER OVER GATE

(71) Applicant: Taiwan Semiconductor Manufacturing Company, Ltd., Hsin-Chu (TW)

(72) Inventors: Chung-Yuan Yang, Kaohsiung (TW); Jen-Pan Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/660,728

(22) Filed: Oct. 25, 2012

(65) Prior Publication Data

US 2014/0117467 A1  May 1, 2014

(51) Int. Cl.
*H01L 29/66* (2006.01)
*H01L 21/8234* (2006.01)

(52) U.S. Cl.
CPC .. *H01L 29/6659* (2013.01); *H01L 21/823468* (2013.01); *H01L 29/6656* (2013.01); *H01L 29/66545* (2013.01); *H01L 29/66553* (2013.01)

(58) Field of Classification Search
CPC ..... H01L 21/823443; H01L 21/823468; H01L 21/823835; H01L 21/823864; H01L 29/665; H01L 29/66553; H01L 29/6656; H01L 29/66575; H01L 29/6659
USPC ....... 438/230, 231, 299, 301, 303, 305, 306, 438/618, 620–622, 637–640, 672, 675; 257/336, 344, 346, 377, 382–385, 387, 257/408, 758–760, 774
See application file for complete search history.

(56) References Cited

U.S. PATENT DOCUMENTS

| | | | |
|---|---|---|---|
| 5,686,331 A * | 11/1997 | Song | 438/303 |
| 5,981,325 A * | 11/1999 | Hung | 438/224 |
| 6,307,226 B1 * | 10/2001 | Dennison | H01L 23/485 257/296 |
| 6,414,375 B1 * | 7/2002 | Ohkawa | 257/637 |
| 6,417,055 B2 * | 7/2002 | Jang | H01L 21/76897 257/E21.438 |
| 6,743,690 B2 * | 6/2004 | Ku et al. | 438/306 |
| 7,601,598 B2 * | 10/2009 | Juengling | H01L 21/26586 257/E21.165 |
| 7,696,050 B2 * | 4/2010 | Yamaguchi et al. | 438/299 |
| 2008/0001222 A1 * | 1/2008 | Rhee | H01L 29/7802 257/339 |
| 2009/0315116 A1 * | 12/2009 | Sakuma | H01L 21/28518 257/368 |
| 2011/0269278 A1 * | 11/2011 | Hoentschel et al. | 438/230 |
| 2014/0103404 A1 * | 4/2014 | Li | H01L 21/823842 257/288 |

FOREIGN PATENT DOCUMENTS

TW  I222175  1/2005

* cited by examiner

*Primary Examiner* — Bryan R Junge
(74) *Attorney, Agent, or Firm* — Slater Matsil, LLP

(57) ABSTRACT

A metal-oxide-semiconductor field-effect transistor (MOSFET) includes a substrate, a source and a drain in the substrate, a gate electrode disposed over the substrate between the source and drain. An inner spacer is disposed at least partially over the gate electrode. An outer spacer is disposed adjacent to a sidewall of the gate electrode.

20 Claims, 2 Drawing Sheets

METAL-OXIDE-SEMICONDUCTOR FIELD-EFFECT TRANSISTOR WITH SPACER OVER GATE

TECHNICAL FIELD

The present disclosure relates generally to an integrated circuit and more particularly to a metal-oxide-semiconductor field-effect transistor (MOSFET).

BACKGROUND

As the size of integrated circuits shrink, lithographic overlay specifications for fabrication have less margin of error for more advanced technologies. In particular, there is a concern for MOSFET fabrication that source/drain and gate electrodes can be bridged or leakage paths can be created during the fabrication process due to the shrinking of critical dimensions.

BRIEF DESCRIPTION OF THE DRAWINGS

Reference is now made to the following descriptions taken in conjunction with the accompanying drawings, in which.

DETAILED DESCRIPTION

Figure 1:
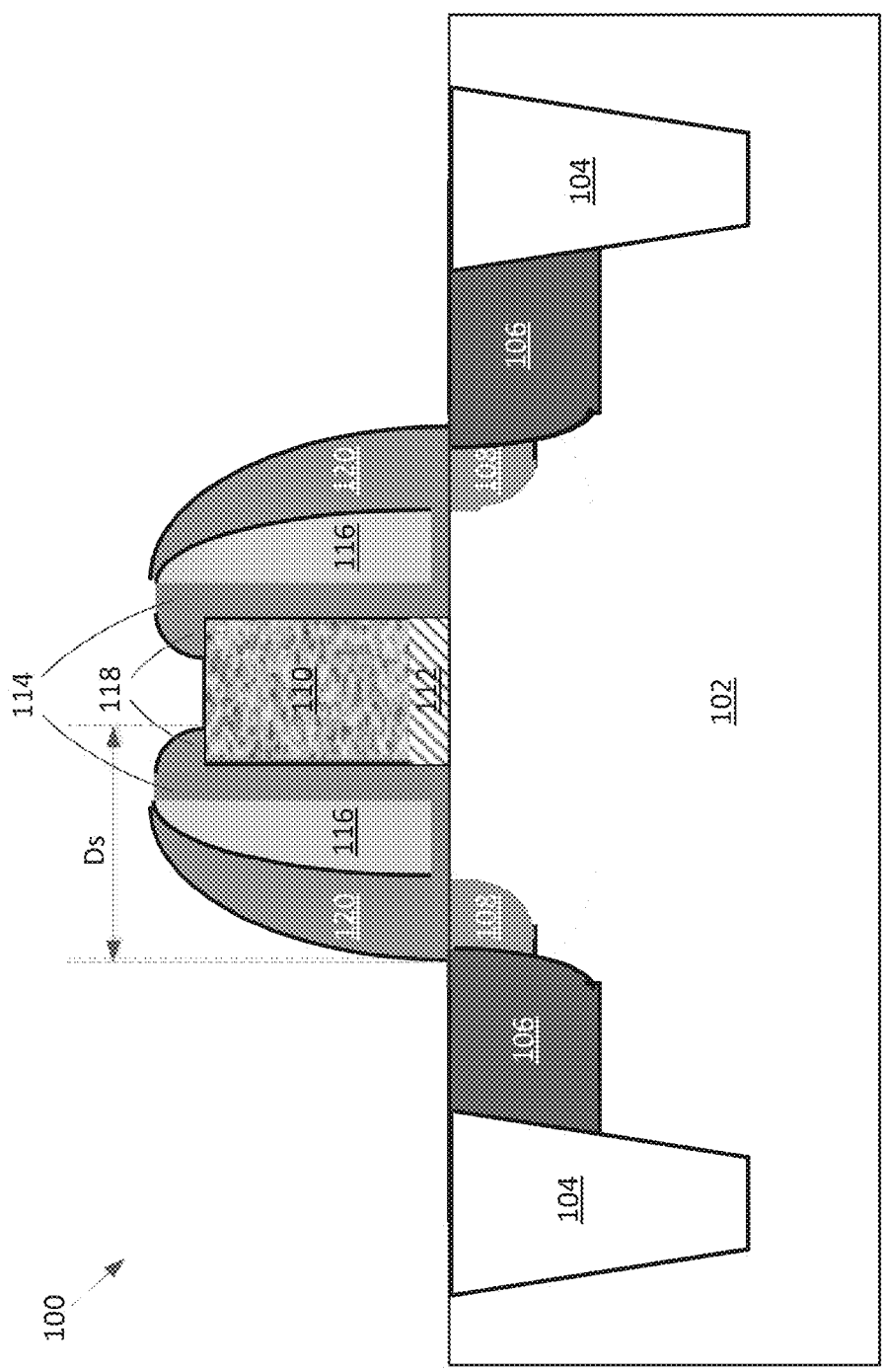
FIG. 1 is a schematic diagram of an exemplary MOSFET according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary MOSFET 100 according to some embodiments. The MOSFET 100 includes a substrate 102, shallow trench isolation (STI) structures 104, source/drain regions 106, lightly doped regions 108, a gate electrode 110, a gate dielectric layer 112, a tetraethyl orthosilicate (TEOS) layer 114, an offset spacer 116, an inner spacer 118, and an outer spacer 120.

The substrate 102 provides support and serves as the foundation upon which integrated circuit devices are fabricated. The substrate 102 comprises silicon, silicon dioxide, aluminum oxide, sapphire, germanium, gallium arsenide (GaAs), an alloy of silicon and germanium, indium phosphide (InP), silicon on isolator, or any other suitable material. The STI structures 104 provide electrical isolation of the MOSFET 100 from neighboring devices. The STI structures 104 comprise silicon dioxide, for example, and can be formed by etching a trench and depositing silicon dioxide and/or other dielectrics to fill the trench. Other isolation features, such as field oxide (FOX) are also contemplated.

The gate electrode 110 comprises polysilicon, metal, or any other suitable material. The gate dielectric 112 comprises silicon dioxide metal oxides such as HfOx, TaOx, and the like, or any other suitable dielectric material. The lightly doped regions 108 adjacent to the gate electrode 110 are used to avoid short-channel effect. The lightly doped regions 108 are located between the gate electrode 110 and the source/drain regions 106 at the substrate 102 surface. The lightly doped regions 108 are doped with an N-type or P-type dopants such as phosphorous or boron by ion implantation, for example.

The TEOS layer 114 and offset spacer 116 are adjacent to the sidewall of the gate electrode 110. The offset spacer 116 comprises silicon nitride, for example. The offset spacer 116 is used for the definition of the lightly doped regions 108 and functions as a mask for a self-aligned formation of the lightly doped regions 108 in some embodiments. The source/drain regions 106 are doped with an N-type or P-type dopants such as phosphorous or boron by ion implantation, for example.

The inner spacer 118 and outer spacer 120 comprise silicon dioxide, silicon nitride, other dielectric, or any other suitable material. The inner spacer 118 is at least partially over the gate electrode 110. The portion of the gate electrode 110 covered by the inner spacer 118 varies depending on the size and design of the device and process, for example. Even though the inner spacer 118 covers the gate electrode 110 partially in FIG. 1, the inner spacer 118 can cover the gate electrode 110 completely in some other embodiments, although in such embodiments a portion of the gate electrode 110 extends outside the covered area to an electrical connection pad, or at least some portion of the gate electrode 110 may be subsequently exposed to allow for gate contact. The outer spacer 120 is adjacent to the offset spacer 116 and the sidewall of the gate electrode 110.

With the increased spacer width Ds by having the inner spacer 118 in addition to the outer spacer 120, the lithographic overlay window is increased for the MOSFET 100 fabrication to reduce the risk of bridging the source/drain regions 106 and the gate electrode 110 or creating a leakage path during fabrication process due to small dimension of devices.

FIGS. 2A-2F are exemplary intermediate steps of fabricating the MOSFET 100 in FIG. 1 according to some embodiments.

Figure 2A:
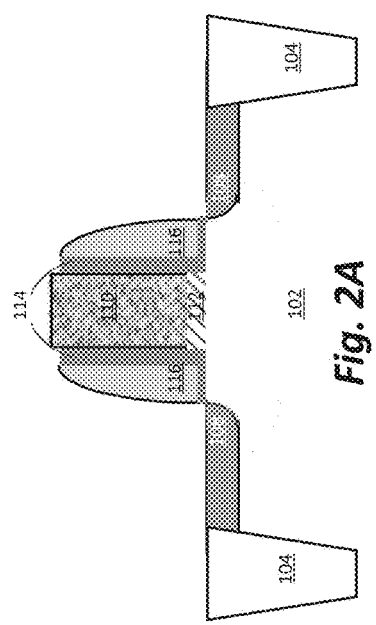
FIGS. 2A-2F are exemplary intermediate steps of fabricating the MOSFET in FIG. 1 according to some embodiments.

In FIG. 2A, on the substrate 102, STI structures 104, a gate dielectric layer 112, a gate electrode 110, TEOS layer 114, and the offset spacer 116 are formed by any suitable methods known in the art. A silicon dioxide layer for the gate dielectric layer 112 is grown or otherwise formed on the substrate 102 and a polysilicon layer for the gate electrode 110 is deposited over the silicon dioxide and patterned to form the gate dielectric layer 112 and the gate electrode 110 respectively, in one example. In some embodiments, gate electrode 110 could be a dummy gate electrode that is subsequently removed and replaced with, e.g., a metal gate, such as in a gate late process.

The offset spacer 116, e.g., silicon nitride or silicon dioxide, can be formed by chemical vapor deposition and etching, for example. The lightly doped regions 108 are formed by ion implantation using the gate electrode 110 and the offset spacer 116 as a mask in some embodiments so that the lightly doped regions 108 are self-aligned to the edges of the offset spacer 116.

Figure 2B:
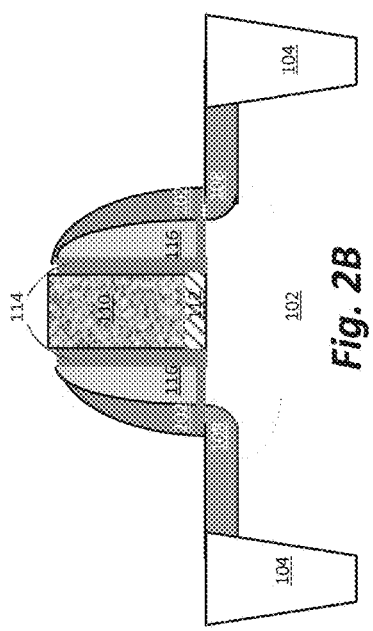

In FIG. 2B, another spacer 202, e.g., silicon nitride or silicon dioxide, is formed by chemical vapor deposition and etching, for example.

Figure 2C:
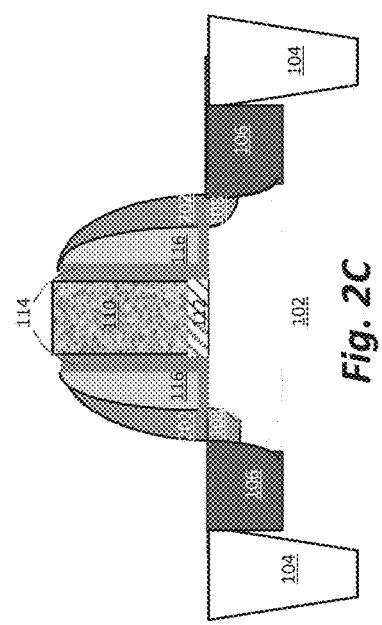

In FIG. 2C, the source/drain regions 106 are formed by ion implantation using the gate electrode 110 and the spacer 202 as a mask in some embodiments so that the source/drain regions 106 are self-aligned to the edges of the spacer 202.

Figure 2D:
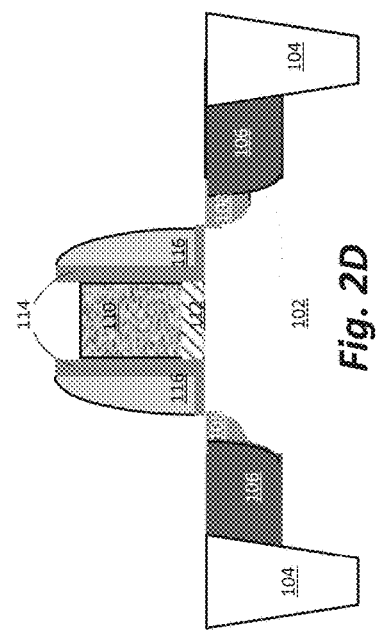

In FIG. 2D, the spacer 202 is removed, and the gate electrode 110 is etched by dry or wet etching in some embodiments. The depth of etching depends on the size of the gate electrode 110 and the process, for example.

Figure 2E:
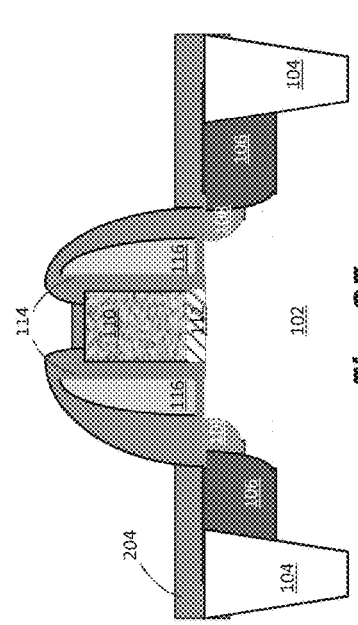

In FIG. 2E, a dielectric layer 204 such as silicon dioxide or silicon nitride layer is deposited.

Figure 2F:
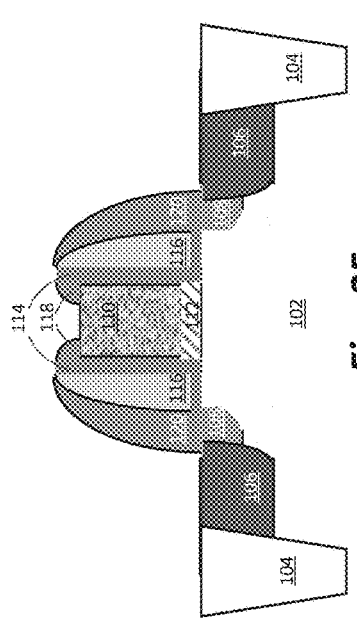

In FIG. 2F, the dielectric layer 204 is etched to form the inner spacer 118 and the outer spacer 120. The inner spacer 118 is at least partially over the gate electrode 110. The outer spacer 120 is adjacent to the offset spacer 116 and the sidewall of the gate electrode 110. The portion of the gate electrode 110 covered by the inner spacer 118 varies depending on the size and design of the device and process, for example. Even though the inner spacer 118 covers the gate electrode 110 partially in FIG. 2F, the inner spacer 118 can cover the gate electrode 110 completely in some other embodiments.

The lithographic overlay window, e.g., contact window to the source/drain regions 106 and the gate electrode 110, is improved by increased Ds (shown in FIG. 1) with the addition of the inner spacer 118 over the gate electrode 110 for the MOSFET 100 fabrication. This helps to reduce the risk of bridging the source/drain 106 and the gate electrode 110 or creating a leakage path during fabrication process due to the shrinking critical dimension of devices.

According to some embodiments, a metal-oxide-semiconductor field-effect transistor (MOSFET) includes a substrate, a source and a drain in the substrate, a gate electrode disposed over the substrate between the source and drain. An inner spacer is disposed at least partially over the gate electrode. An outer spacer is disposed adjacent to a sidewall of the gate electrode.

According to some embodiments, a method of fabricating a metal-oxide-semiconductor field-effect transistor (MOSFET) includes forming a source and a drain in a substrate. A gate electrode is formed over the substrate between the source and the drain. An inner spacer is formed at least partially over the gate electrode and an outer spacer is formed adjacent to a sidewall of the gate electrode.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of fabricating a metal-oxide-semiconductor field-effect transistor (MOSFET), comprising:
   forming a source and a drain in a substrate;
   forming a conductive gate electrode over the substrate between the source and the drain;
   forming a tetraethyl orthosilicate (TEOS) layer adjacent to a sidewall of the conductive gate electrode, wherein a portion of the TEOS layer extends laterally away from the conductive gate electrode;
   forming an offset spacer adjacent to the TEOS layer and over the portion of the TEOS layer extending laterally away from the conductive gate electrode, wherein no implantation process is performed after forming the conductive gate electrode and before forming the offset spacer;
   after forming the offset spacer, recessing the conductive gate electrode to expose a sidewall of the TEOS layer;
   after recessing the conductive gate electrode, depositing a dielectric layer directly on the conductive gate electrode and over the offset spacer;
   etching the dielectric layer to simultaneously form an outer spacer adjacent to the offset spacer and an inner spacer, the inner spacer at least partially over the conductive gate electrode; and
   forming a lightly doped region disposed adjacent to the source in the substrate using the offset spacer as a mask.

2. The method of claim 1, further comprising forming a gate dielectric between the substrate and the conductive gate electrode.

3. The method of claim 1, wherein the conductive gate electrode comprises polysilicon.

4. The method of claim 1, wherein the inner spacer and the outer spacer comprise silicon nitride or silicon dioxide.

5. The method of claim 1, wherein the offset spacer comprises silicon nitride.

6. The method of claim 1, further comprising forming at least a shallow trench isolation (STI) structure in the substrate prior to forming the source and the drain.

7. The method of claim 1, wherein forming the source and the drain in the substrate comprises:
   forming a sacrificial spacer adjacent the offset spacer;
   performing an implantation process on the substrate using the sacrificial spacer as a mask; and
   removing the sacrificial spacer.

8. A method comprising:
   forming a gate stack over a substrate, the gate stack comprising a gate dielectric and a conductive gate electrode over the gate dielectric;
   forming an L-shaped spacer on a sidewall of the gate stack, wherein no implantation process is performed after forming the gate stack and before forming the L-shaped spacer;

forming an offset spacer adjacent to the L-shaped spacer;
forming a sacrificial spacer adjacent the offset spacer;
performing an implantation process on the substrate using the gate stack, the L-shaped spacer, the offset spacer and the sacrificial spacer as an implantation mask;
removing the sacrificial spacer;
after removing the sacrificial spacer, recessing the conductive gate electrode below a topmost surface of the L-shaped spacer;
after recessing the conductive gate electrode, blanket depositing a dielectric layer over the gate stack, the L-shaped spacer and the offset spacer; and
etching the dielectric layer to simultaneously form an outer spacer adjacent to the offset spacer and an inner spacer over the gate stack.

9. The method of claim 8, wherein the dielectric layer comprises silicon nitride or silicon dioxide.

10. The method of claim 8, wherein the L-shaped spacer comprises tetraethyl orthosilicate (TEOS).

11. The method of claim 8, wherein the offset spacer comprises silicon nitride.

12. The method of claim 8, wherein the gate stack is a dummy gate stack.

13. The method of claim 12, further comprising replacing the dummy gate stack with a metal gate stack.

14. The method of claim 8, wherein the sacrificial spacer comprises silicon nitride or silicon dioxide.

15. A method comprising:
forming a gate stack over a substrate, the gate stack comprising a gate dielectric and a conductive gate electrode over the gate dielectric;
forming an L-shaped spacer on a sidewall of the gate stack, wherein no implantation process is performed after forming the gate stack and before forming the L-shaped spacer;
forming an offset spacer adjacent to the L-shaped spacer;
performing a first implantation process on the substrate using the gate stack, the L-shaped spacer and the offset spacer as an implantation mask to form a lightly doped region in the substrate;
after performing the first implantation process, forming a sacrificial spacer adjacent the offset spacer;
performing a second implantation process on the substrate using the gate stack, the L-shaped spacer, the offset spacer and the sacrificial spacer as an implantation mask to form a source/drain region;
removing the sacrificial spacer;
after removing the sacrificial spacer, etching the conductive gate electrode to expose a sidewall of the L-shaped spacer;
after recessing the gate stack, blanket depositing a dielectric layer over the gate stack, the L-shaped spacer and the offset spacer; and
etching the dielectric layer to simultaneously form an outer spacer adjacent to the offset spacer and an inner spacer over the conductive gate electrode, wherein the outer spacer is in physical contact with the lightly doped region.

16. The method of claim 15, wherein the inner spacer partially covers a topmost surface of the conductive gate electrode.

17. The method of claim 15, further comprising forming an isolation region in the substrate adjacent the source/drain region.

18. The method of claim 15, wherein a bottommost surface of the L-shaped spacer is substantially level with a bottommost surface of the outer spacer.

19. The method of claim 15, wherein the outer spacer is in physical contact with the source/drain region.

20. The method of claim 15, wherein the inner spacer is in physical contact with the sidewall of the L-shaped spacer and a topmost surface of the conductive gate electrode.

* * * * *